US006946687B2

(12) United States Patent
Eisert et al.

(10) Patent No.: US 6,946,687 B2
(45) Date of Patent: Sep. 20, 2005

(54) RADIATION-EMITTING SEMICONDUCTOR CHIP WITH A RADIATION-EMITTING ACTIVE LAYER

(75) Inventors: Dominik Eisert, Regensburg (DE); Volker Härle, Waldetzenberg (DE); Uwe Strauss, Bad Abbach (DE); Ulrich Zehnder, Regensburg (DE)

(73) Assignee: Osram GmbH, Munich (DE)

( * ) Notice: Subject to any disclaimer, the term of this patent is extended or adjusted under 35 U.S.C. 154(b) by 0 days.

(21) Appl. No.: 10/345,443

(22) Filed: Jan. 10, 2003

(65) Prior Publication Data

US 2004/0004226 A1 Jan. 8, 2004

Related U.S. Application Data

(63) Continuation of application No. PCT/DE01/02566, filed on Jul. 10, 2001.

(30) Foreign Application Priority Data

Jul. 10, 2000 (DE) .......................................... 100 33 496

(51) Int. Cl.$^7$ .......................... H01N 1/02; H01L 33/00; H01L 29/22
(52) U.S. Cl. ............................. 257/95; 257/85; 257/94; 257/103
(58) Field of Search .............................. 148/33; 257/77, 257/79, 80, 85, 93–95, 98, 103, 78; 372/92

(56) References Cited

U.S. PATENT DOCUMENTS

| 5,260,588 | A | | 11/1993 | Ohta et al. |
| 5,753,940 | A | | 5/1998 | Komoto |
| 5,814,839 | A | * | 9/1998 | Hosoba .................... 257/96 |
| 6,229,160 | B1 | | 5/2001 | Krames et al. |
| 6,323,063 | B2 | | 11/2001 | Krames et al. |
| 2001/0000209 | A1 | | 4/2001 | Krames et al. |
| 2001/0000410 | A1 | | 4/2001 | Krames et al. |
| 2002/0093023 | A1 | | 7/2002 | Krames et al. |

FOREIGN PATENT DOCUMENTS

| DE | 24 21 590 A1 | 11/1975 |
| DE | 44 27 840 A1 | 2/1996 |
| DE | 198 07 758 A1 | 12/1998 |
| GB | 2 326 023 A | 12/1998 |
| GB | 2 331 625 A | 5/1999 |
| JP | 56-50586 | 5/1981 |
| JP | 58131782 | 8/1983 |
| JP | 61125092 | 6/1986 |
| JP | 06120560 | 4/1994 |
| JP | 07015033 A | 1/1995 |
| JP | 07131066 | 5/1995 |
| JP | 08222763 | 8/1996 |
| JP | 08288543 A | 11/1996 |
| JP | 10275935 A | 10/1998 |
| JP | 11220163 A | 8/1999 |
| WO | WO 99/31738 | 6/1999 |

OTHER PUBLICATIONS

Lee S J et al, "Efficiency Improvement in Light–Emitting Diodes Based on Geometrically Deformed Chips," SPIE Conference on Light–Emitting Diodes, San Jose, CA, Jan. 1999, pp. 237–248.*
Freeman, W. H., "Optics," pp. 34–37, 10th ed., Published by Butterworth–Heinemann, Linacre House, Oxford, UK, 1990.*

* cited by examiner

*Primary Examiner*—Minhloan Tran
*Assistant Examiner*—Thomas L. Dickey
(74) *Attorney, Agent, or Firm*—Laurence A. Greenberg; Werner H. Stemer; Ralph E. Locher

(57) ABSTRACT

Recesses interrupt an active layer on a semiconductor chip to improve the coupling out of light. As a result, side faces of the active layer appear, as seen from a light-generating point, at a large solid angle and the paths of light in the active layer are shortened.

16 Claims, 3 Drawing Sheets

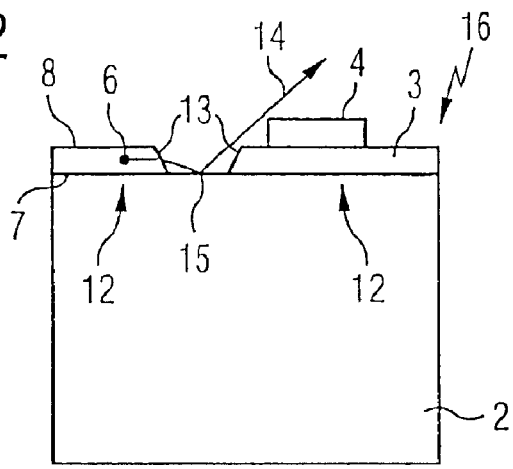
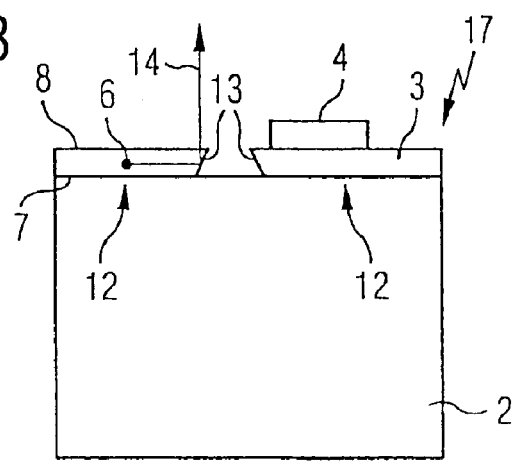
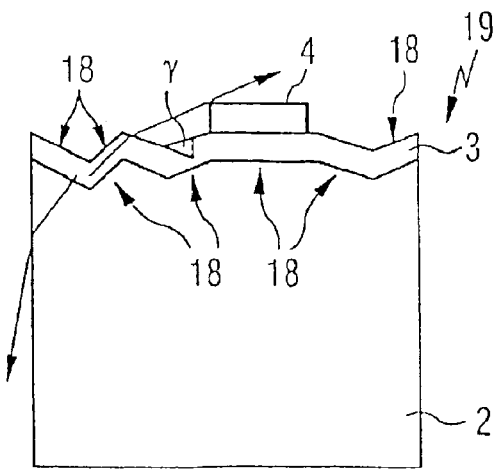

RADIATION-EMITTING SEMICONDUCTOR CHIP WITH A RADIATION-EMITTING ACTIVE LAYER

CROSS-REFERENCE TO RELATED APPLICATION

This application is a continuation of copending International Application No. PCT/DE01/02566, filed Jul. 10, 2001, which designated the United States and was not published in English.

BACKGROUND OF THE INVENTION

Field of the Invention

The invention relates to a radiation-emitting semiconductor chip with a radiation-emitting active layer.

Such a semiconductor chip is disclosed in German Published, Non-Prosecuted Patent Application DE 198 07 758 A1, corresponding to United States Patent Application Publication US2002/093023A1 to Camras et al. and United States Patent Application Publications US2001/00410A1, US2001/00209A1, US2000/6323063B2, and US2000/6229160B2 to Krames et al. The prior art semiconductor chip has a heterostructure applied to a substrate and includes a multiplicity of doped epitaxial layers of the p and n types. Formed along the interface between the epitaxial layers of the p and n types is an active layer in which photons are generated.

To improve the coupling out of light from the prior art semiconductor chip, the chip is formed with a frustopyramidal shape. It is ensured by the beveled side faces that the light generated by the active layer can leave the semiconductor chip after few reflections on the side faces.

One disadvantage of the prior art semiconductor chip is that the light yield does not correspond to what would actually be expected based upon the geometrical conditions and refractive indices. This is primarily due to the absorption losses as the rays of light pass through the material and are reflected on the side faces.

SUMMARY OF THE INVENTION

It is accordingly an object of the invention to provide a radiation-emitting semiconductor chip that overcomes the hereinafore-mentioned disadvantages of the heretofore-known devices of this general type and that provides a semiconductor chip with improved coupling out of light.

With the foregoing and other objects in view, there is provided, in accordance with the invention, a radiation-emitting semiconductor chip, including a substrate having a main surface area and a series of layers disposed on the main surface area, at least one of the layers being a radiation-emitting active layer subdivided into subregions, each of the subregions having side faces disposed transverse to the active layer.

According to the invention the active layer is subdivided into a multiplicity of subregions with side faces running transversely in relation to the active layer.

The subdivision of the active layer into a multiplicity of subregions has the effect of increasing the overall surface area of the side faces. Furthermore, seen from each light spot of the active layer, the nearest side face in each case appears at a greater solid angle. Therefore, many of the rays of light emanating from the light spot of the active layer impinge directly on a side face and, from there, can leave the semiconductor chip.

Although the subdivision of the active layer into a multiplicity of subregions causes a fraction of the active layer to be lost for generating light, in return, the coupling out of the light is significantly improved. Therefore, the overall effect is that the efficiency of the light generation is improved by the proposed measures.

In accordance with another feature of the invention, at least one of the active layer and the series of layers is subdivided by recesses.

In accordance with a further feature of the invention, the recesses completely interrupt the active layer.

In accordance with an added feature of the invention, the series of layers has a side facing away from the substrate and the recesses extend from the side facing away from the substrate one of up to the main surface area of the substrate and into the substrate.

In accordance with an additional feature of the invention, the active layer is subdivided into tiles.

In accordance with yet another feature of the invention, at least one of the recesses has a side face disposed at an angle with respect to the main surface area of the substrate.

In accordance with yet a further feature of the invention, at least one of the recesses has a side face disposed at an angle other than 90° with respect to the main surface area of the substrate.

In accordance with yet an added feature of the invention, the series of layers has an opposing side opposite the substrate and, viewed from the opposing side towards the main surface area of the substrate, at least one of the recesses tapers.

In accordance with yet an additional feature of the invention, the active layer generates radiation, the at least one recess has at least some of the side faces and a bottom face, and the side faces of the at least one recess are separated from one another at a distance to cause at least part of the radiation generated in the active layer to impinge on the bottom face.

In accordance with again another feature of the invention, the active layer has a principal extent and a portion of the radiation propagating substantially parallel to a direction of the principal extent impinges on the bottom face.

In accordance with again a further feature of the invention, the side faces of the at least one recess are separated from one another to cause at least a portion of the radiation impinging on the bottom face to be reflected on the bottom face and subsequently be coupled out of at least one of the substrate and the series of layers.

In accordance with again an added feature of the invention, the series of layers has a side facing away from the main surface area and, viewed from the main surface area, at least one of the recesses tapers in a direction of the side of the series of layers facing away from the main surface area.

In accordance with again an additional feature of the invention, the side faces totally reflect at least part of the radiation generated in the active layer.

In accordance with still another feature of the invention, the active layer has a principal extent and the side faces totally reflect a portion of the radiation propagating parallel to the principal extent.

In accordance with still a further feature of the invention, the active layer has a principal extent, the recesses have side faces, and the side faces transmit a portion of the radiation propagating parallel to the principal extent.

In accordance with still an added feature of the invention, the side faces are separated by a distance to cause the portion of the radiation propagating parallel to the principal extent leaves at least one of the substrate and the series of layers immediately after refraction on one of the side faces.

In accordance with still an additional feature of the invention, the active layer is subdivided into flat portions having upper sides and undersides, the flat portions are disposed at an angle with respect to one another, and the upper sides and the undersides respectively form the side faces for neighboring ones of the subregions.

In accordance with another feature of the invention, the upper side and the underside of a given one of the subregions transmit central rays of light of neighboring subregions along the active layer.

In accordance with a further feature of the invention, the substrate contains a material selected from at least one of a group consisting of silicon, silicon oxide, silicon carbide, and sapphire.

In accordance with an added feature of the invention, the series of layers contains compounds selected from at least one of a group consisting of GaN, AlGaN, InGaN, AlInGaN.

In accordance with an additional feature of the invention, the active layer contains compounds selected from at least one of a group consisting of GaN, AlGaN, InGaN, AlInGaN.

In accordance with yet another feature of the invention, the series of layers is an epitaxial application to the substrate.

With the objects of the invention in view, there is also provided a radiation-emitting semiconductor chip, including a substrate having a main surface area and a series of layers disposed on the main surface area, at least one of the layers being a radiation-emitting active layer disposed in a first plane and subdivided into subregions, each of the subregions having side faces disposed in a second plane transverse to the first plane.

Other features that are considered as characteristic for the invention are set forth in the appended claims.

Although the invention is illustrated and described herein as embodied in a radiation-emitting semiconductor chip, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

BRIEF DESCRIPTION OF THE DRAWINGS

FIG. 2 is a fragmentary, cross-sectional view of another exemplary embodiment of the chip of FIGS. 1C and 1D in which recesses in an active layer have beveled side faces;

FIG. 3 a fragmentary, cross-sectional view of a third exemplary embodiment of the chip of FIGS. 1C and 1D in which the recesses in the active layer are undercut;

FIG. 4 a fragmentary, cross-sectional view of a third exemplary embodiment of the chip of FIGS. 1C and 1D in which the active layer is of a multiplicity of flat portions tilted with respect to one another;

DESCRIPTION OF THE PREFERRED EMBODIMENTS

Figure 1A:
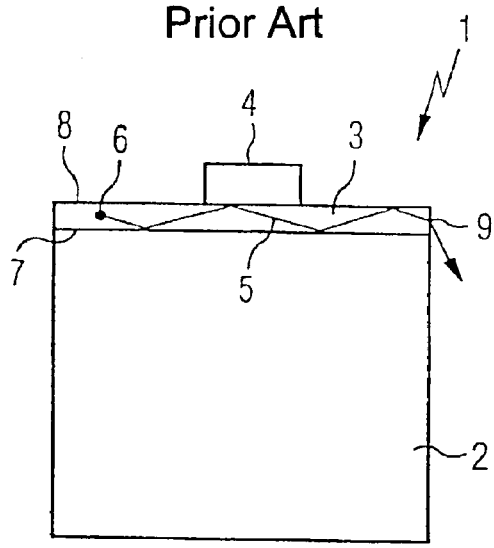
FIGS. 1A and 1B are fragmentary, cross-sectional views of prior art semiconductor chips illustrating paths of rays of light in active layers of the chip.

Referring now to the figures of the drawings in detail and first, particularly to FIG. 1A thereof, there is shown a conventional optoelectronic semiconductor chip 1, which has a substrate 2 with a main surface area, to which an active layer 3 has been applied.

Provided on the active layer 3 are contact pads 4. These contact pads 4 also contribute to the losses in the semiconductor chip 1. For example, a ray of light 5, which emanates from a light-generating point 6 within the active layer 3, is initially reflected on an underside 7 and then on an upper side 8. The ray of light 5, thereby, impinges on the underside of the contact pad 4 and is partially absorbed there. The same applies to the further reflections on the underside 7 and the upper side 8. With each reflection, part of the intensity of the ray of light 5 is lost. Moreover, losses are incurred as the ray 5 passes through the material of the active layer 3. The ray of light 5 is, therefore, greatly attenuated when it emerges from a side face 9 of the active layer 3.

Figure 1B:
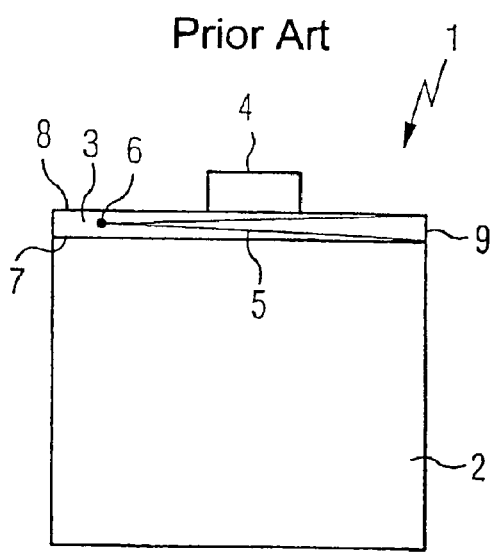

Added to this is the fact that only a small proportion in terms of the solid angle of the light emanating from the light-generating point 6 impinges directly on the side face 9. This becomes clear from FIG. 1B. Those rays of light that lie outside the solid angle range within which the side faces 9 appear, as seen from the light-generating point 6, are reflected more or less frequently on the underside 7 and the upper side 8 of the active layer 3 and attenuated in their intensity.

Figure 1C:
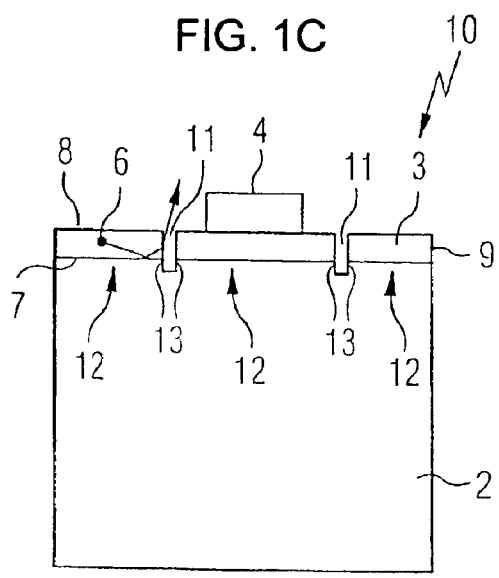
FIGS. 1C and 1D are fragmentary, cross-sectional views of exemplary embodiments of semiconductor chips according to the invention respectively illustrating paths of rays of light.
Figure 1D:
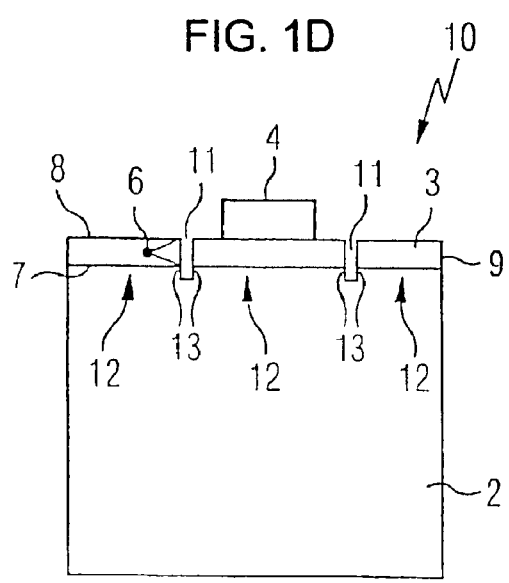

To improve the coupling out of the light, the semiconductor chip 10 represented in FIGS. 1C and 1D has been provided with recesses 11 in the active layer 3, by which the active layer 3 is subdivided into subregions 12.

In the case of the invention, the designation 'active layer' stands for those layers of the semiconductor chip 1 that contribute to the generation of light. These include not only that zone in which light is generated but also the adjacent current carrying layers. Furthermore, a series of layers that include the active layer 3 may have been applied to the substrate 2. Further layers of the series of layers may serve, for example, for the contacting of the active layer, for lattice matching, for carrying current or for guiding the optical field.

For the sake of simplicity, on the substrate in the figures of the drawing only one layer 3 is represented, referred to below as the active layer for short. This is also to be understood as meaning a series of layers including the active layer, that are combined in the figures to form the layer 3.

It should also be noted that, in the case of the invention, the term 'rays of light' is intended to mean not only rays with wavelengths in the visible wavelength range. Rather, the considerations presented here apply, in principle, to any type of electromagnetic radiation, in particular, to light in the overall spectral range from infrared to ultraviolet. The term 'ray of light' used in relation to geometrical optics is, therefore, not intended to imply a specific wavelength of the electromagnetic radiation.

The subregions of the active layer 3 may, for example, be disposed in plan view on the active layer in the manner of tiles. This is to be understood as meaning a two-dimensional configuration in the plane of the active layer based upon a recurring pattern.

In the case of the invention, preferably, GaN-based semiconductor materials, such as, for example, GaN, AlGaN, InGaN, or AlInGaN, are suitable as the material for the series of layers and, in particular, for the active layer 3. Such series of layers may be produced epitaxially, SiC substrates, sapphire substrates, or Si substrates, and also composite substrates formed therefrom, being used with preference as the epitaxial substrate.

The subdivision of the active layer 3 into a plurality of subregions ensures that the ray of light 5 emanating from the light-generating point 6 impinges on one of the side faces 13 of the recesses 11 after few reflections. On account of the small surface-area extent of the subregions 12, the side faces 13 appear at great solid angles, as seen from the light-generating point 6. This means that a correspondingly large proportion of the rays of light emanating from the light-generating point 6 impinges directly on the side faces 13 and is transmitted there to the outside. The latter is clearly evident from FIG. 1D, in particular.

As far as possible, the light that emerges in the recesses 11 is not to be coupled back into the active layer 3 on the opposite side faces 13. This aim can be achieved by special shaping of the side faces 13 of the recesses 11.

For example, it is possible, as represented in FIG. 2, to bevel the side faces 13. A ray of light 14 propagating in the direction of principal extent of the active layer 3, i.e., running substantially parallel to a plane of the layer defined by the active layer 3, referred to hereafter as the central ray of light 14, is, then, reflected in the direction of a bottom 15 of the recess 11 when it passes through the side faces 13. At the bottom 15, the central ray of light 14 impinges on the substrate 2 and is reflected there. If the recess 11 is adequately wide, the ray of light 14 is coupled out. This means, in particular, that the ray of light 14 leaves the semiconductor chip without re-entering the series of layers or impinging on the active layer 3.

In the case of the semiconductor chip 16 represented in FIG. 2, therefore, there is no risk of the rays of light that emerge from the active layer 3 being coupled back into the active layer 3.

A further possibility is represented in FIG. 3. In the case of the semiconductor chip 17 represented in FIG. 3, the recess tapers from the substrate in the direction of the side of the active layer opposite from the substrate. The recess 11 is, in this case, undercut to such an extent that the central ray of light 14 is totally reflected on the side face 13. The inclination of the side face is chosen, in particular, such that the central ray of light 14 impinges on the side face 13 at a great angle, in particular, a right angle, onto the upper side 8 and is transmitted there.

Finally, there is the possibility of composing the active layer 3 from flat subregions 18 that are tilted with respect to one another. In the case of such a configuration of the active layer 3, the side faces of a subregion 18 are formed by the upper side 8 or underside 7 of one of the neighboring subregions 18. So that total reflection does not take place on the upper side 8 or the underside 7, the tilting angle γ must be greater than the critical angle for total reflection, the critical angle for total reflection being defined by $\sin \alpha_C = n_2/n_1$, where $n_2$ is the refractive index in the medium adjacent to the active layer 3 and $n_1$ is the refractive index in the active layer 3.

Figure 5:
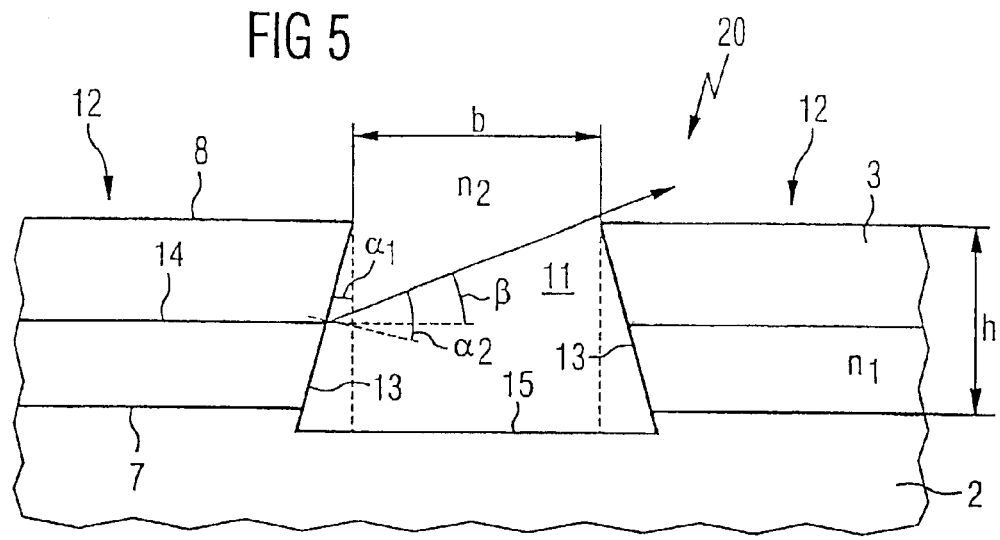
FIG. 5 is a fragmentary, enlarged cross-sectional view of a detail of the chip of FIG. 3.

Finally, represented in FIG. 5 is the case in which the recesses 11 are undercut as in FIG. 3. In this case, the flank angle $\alpha_1$ of the recess 11 lies between 0° and the critical angle for total reflection $\alpha_C$. Therefore, in this case, the central ray of light 14 is refracted in the direction of the upper side 8. To prevent the central ray of light 14 from impinging on the opposite side faces 13, the width of the recesses 11 must be chosen to be adequately wide. The condition for the adequate width can easily be taken from FIG. 5, in that, the following must apply for the width b of the recess 11:

$$b \geq \frac{h}{2\tan(\alpha_1 - \alpha_1)}, \text{ with:}$$

$$\sin\alpha_1 = \frac{n_1}{n_2}\sin\alpha_2,$$

where: h is the thickness of the active layer 3; $\alpha_1$ and $\alpha_2$ are respectively the angles between the normal to the surface of the side face 13 and the incident ray of light 14 and the transmitted ray of light 14, and $n_1$ and $n_2$ are the refractive indices in the active layer 13 and in the recess 11. This achieves the effect that the ray of light is refracted on the side face of the recess and leaves the semiconductor chip immediately thereafter. This means, in particular, that the ray of light does not re-enter the series of layers.

Figure 6:
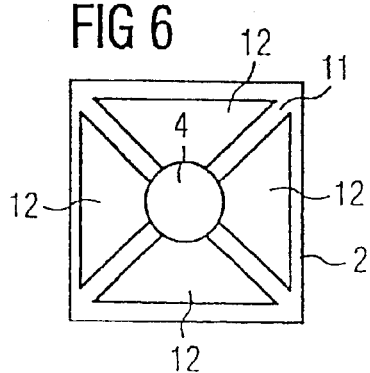
FIGS. 6 to 8 are fragmentary, plan views of alternative embodiments of recesses of a semiconductor chip according to the invention.
Figure 7:
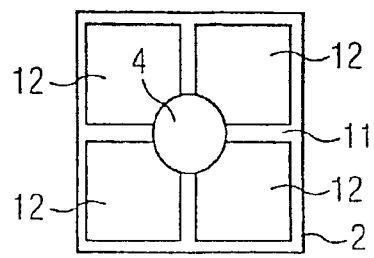

For the configuration of the surface of the recesses 11, various forms come into consideration. Two possibilities are represented in FIGS. 6 and 7. In FIG. 6, the recesses 11 are formed in the manner of a St. Andrew's cross, in FIG. 7 in the manner of a cross.

Figure 8:
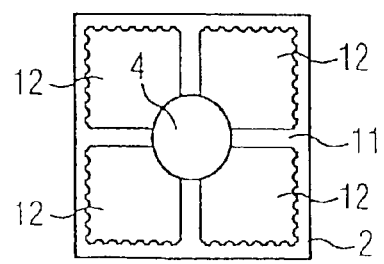

The measures described here can also be combined with further measures to improve the coupling out of the light. For example, the side faces 9 and the upper side 8 may be roughened by suitable treatment. Furthermore, it is possible to provide grooves or similar unevenness in the side faces 3 and the upper side 8 to improve the coupling out of the light. Such an exemplary embodiment is represented, for example, in FIG. 8, in which the active layer is formed in plan view in the form of a postage stamp.

We claim:

1. A radiation-emitting semiconductor chip, comprising:
   a substrate having a main surface area; and
   a series or layers disposed on said main surface area, at least one of said layers being a radiation-emitting active layer generating a radiation, said active layer being subdivided into subregions, each of said subregions having side faces disposed transverse to said active layer;
   at least one of said active layer and said series of layers being subdivided by recesses, said recesses having side faces, at least one of said recesses having a side face disposed at an angle other than 90° with respect to said main surface area of said substrate;
   said at least one of said recesses having at least some of said side faces and a bottom face, said side faces of said at least one of said recesses being separated from one another to cause at least a portion of radiation impinging on said bottom face to be reflected at said bottom face and subsequently be coupled out of at least one of said substrate and said series of layers.

2. The semiconductor chip according to claim 1, wherein said recesses completely interrupt said active layer.

3. The semiconductor chip according to claim 2, wherein:
   said series of layers has a side facing away from said substrate; and
   said recesses extend from said side facing away from said substrate one of up to said main surface area of said substrate and into said substrate.

4. The semiconductor chip according to claim 1, wherein said active layer is subdivided into tiles.

5. The semiconductor chip according to claim 1, wherein:
said series of layers has an opposing side opposite said substrate; and
viewed from said opposing side towards said main surface area of said substrate, at least one of said recesses tapers.

6. The semiconductor chip according to claim 1, wherein:
said active layer has a principal extent; and
a portion of the radiation propagating substantially parallel to a direction of said principal extent impinges on said bottom face.

7. The semiconductor chip according to claim 1, wherein:
said series of layers has a side facing away from said main surface area; and
viewed from said main surface area, at least one of said recesses tapers in a direction of said side of said series of layers facing away from said main surface area.

8. The semiconductor chip according to claim 1, wherein said substrate contains a material selected from at least one of a group consisting of silicon, silicon oxide, silicon carbide, and sapphire.

9. The semiconductor chip according to claim 1, wherein said series of layers contains compounds selected from at least one of a group consisting of GaN, AlGaN, InGaN, AlInGaN.

10. The semiconductor chip according to claim 1, wherein said active layer contains compounds selected from at least one of a group consisting of GaN, AlGaN, InGaN, AlInGaN.

11. The semiconductor chip according to claim 1, wherein said series of layers is an epitaxial application to said substrate.

12. A radiation-emitting semiconductor chip, comprising:
a substrate having a main surface area; and
a series of layers disposed on said main surface area, at least one of said layers being a radiation-emitting active layer generating a radiation, said active layer being subdivided into subregions, each of said subregions having side faces disposed transverse to said active layer;
at least one of said active layer and said series of layers being subdivided by recesses;
said series of layers having a side facing away from said main surface area; and
at least one of said recesses tapering in a direction of said side of said series of layers facing away from said main surface area as viewed from said main surface area.

13. The semiconductor chip according to claim 12, wherein said side faces totally reflect at least part of the radiation generated in said active layer.

14. The semiconductor chip according to claim 13, wherein:
said active layer has a principal extent; and
said side faces totally reflect a portion of the radiation propagating parallel to said principal extent.

15. The semiconductor chip according to claim 12, wherein:
said active layer has a principal extent;
said recesses have side faces; and
said side faces transmit a portion of the radiation propagating parallel to said principal extent.

16. The semiconductor chip according to claim 15, wherein said side faces are separated by a distance to cause said portion of the radiation propagating parallel to said principal extent leaves at least one of said substrate and said series of layers immediately after refraction on one of said side faces.

* * * * *